(12) United States Patent
Mancevski

(10) Patent No.: US 12,403,438 B2
(45) Date of Patent: Sep. 2, 2025

(54) DEVICE AND METHOD FOR CONTINUOUS SYNTHESIS OF GRAPHENE

(71) Applicant: Universal Matter Inc., Burlington (CA)

(72) Inventor: Vladimir Mancevski, Austin, TX (US)

(73) Assignee: Universal Matter Inc., Burlington (CA)

( * ) Notice: Subject to any disclaimer, the term of this patent is extended or adjusted under 35 U.S.C. 154(b) by 440 days.

(21) Appl. No.: 17/777,389

(22) PCT Filed: Nov. 17, 2020

(86) PCT No.: PCT/CA2020/051565
§ 371 (c)(1),
(2) Date: May 17, 2022

(87) PCT Pub. No.: WO2021/092705
PCT Pub. Date: May 20, 2021

(65) Prior Publication Data
US 2022/0401903 A1 Dec. 22, 2022

Related U.S. Application Data

(60) Provisional application No. 62/936,602, filed on Nov. 17, 2019.

(51) Int. Cl.
*B01J 6/00* (2006.01)
*C01B 32/184* (2017.01)

(52) U.S. Cl.
CPC ............ *B01J 6/008* (2013.01); *C01B 32/184* (2017.08)

(58) Field of Classification Search
CPC .................... B01J 6/008; B01J 19/087; B01J 2208/00415; B01J 2219/0809;
(Continued)

(56) References Cited

U.S. PATENT DOCUMENTS

2021/0206642 A1* 7/2021 Tour ...................... C01B 32/184

FOREIGN PATENT DOCUMENTS

| CN | 103145123 A | 6/2013 |
| CN | 113165880 A | 7/2021 |

(Continued)

OTHER PUBLICATIONS

U.S. Appl. No. 62/727,510, filed Sep. 5, 2018 (Year: 2020).*
(Continued)

*Primary Examiner* — Daniel C. McCracken
(74) *Attorney, Agent, or Firm* — Own Innovation; James W. Hinton; Osman Ismaili

(57) ABSTRACT

Provided herein is a method and a device for continuous synthesis of graphene. The device includes a container having a space for holding a carbon source, wherein the container has an entry opening for receiving the carbon source material, at least two electrodes for applying an electrical current through the space for joule heating the carbon source, wherein the space for joule heating the carbon source is between the at least to electrodes, and a movement component for moving the carbon source, with respect to the container, into the entry opening in a first direction and the at least two electrodes apply the electrical current in a second direction, wherein the first direction is not the same as the second direction.

19 Claims, 13 Drawing Sheets

(58) Field of Classification Search
CPC .......... B01J 2219/082; B01J 2219/0824; B01J 2219/083; B01J 2219/0833; B01J 2219/0839; B01J 2219/0841; B01J 2219/0869; B01J 2219/0879; C01B 32/184; C01B 32/182; C01B 32/186; C01B 32/188; C01B 32/19; C01B 32/192; C01B 32/194; C01B 32/196; C01B 32/198; C01B 2204/00; C01B 2204/02; C01B 2204/04; C01B 2204/06; C01B 2204/065; C01B 2204/20; C01B 2204/22; C01B 2204/24; C01B 2204/26; C01B 2204/28; C01B 2204/30; C01B 2204/32; C01B 32/20; C01B 32/205; C01B 32/21; C01B 32/215; C01B 32/22; C01B 32/225; C01B 32/23; C30B 1/02; C30B 29/02; C30B 30/02

See application file for complete search history.

(56) References Cited

FOREIGN PATENT DOCUMENTS

| | | |
|---|---|---|
| EP | 3178967 A1 | 6/2017 |
| JP | 2014141379 A | 8/2014 |
| KR | 101093657 B1 | 12/2011 |
| KR | 20190082534 A | 7/2019 |
| WO | 2019014404 A1 | 1/2019 |
| WO | 2019135502 A1 | 7/2019 |
| WO | 2020051000 A1 | 3/2020 |
| WO | WO 2020/051000 * 3/2020 | ............. C01B 32/19 |

OTHER PUBLICATIONS

U.S. Appl. No. 62/880,482, filed Jul. 30, 2019 (Year: 2020).*
Mogera, et al., Highly Decoupled Graphene Multilayers: Turbostraticity at its Best, J. Phys. Chem. Lett. 2015; 6: 4437-4443 (Year: 2015).*
Garlow, et al., Large-Area Growth of Turbostratic Graphene on Ni(111) via Physical Vapor Deposition, Scientific Reports 2016; 6: 19804—pp. 1-11 (Year: 2016).*
Luong, et al., Gram-scale bottom-up flash graphene synthesis, Nature 2020; 577: 647-651, with Supplementary Information (Jan. 27, 2020) (Year: 2020).*
CIPO as International Searching Authority, International Search Report and Written Opinion for PCT/CA2020/051565, Jan. 27, 2021.
Luong et al.; "Gram-scale bottom-up flash graphene synthesis", Nature, vol. 577, n. 7792, Jan. 1, 2020 (Jan. 1, 2020), pp. 647-651, XP037000663.
Menzel et al.: Joule Heating Characteristics of Emulsion-Templated Graphene Aerogels:, Advanced Functional Materials, Wiley—V C H Verlag GmbH & Co. KGAA DE, vol. 25, No. 1, Sep. 30, 2014 (Sep. 30, 2014), pp. 28-35, XP072298987.
European Patent Office, Extended European Search Report for European Patent Application No. 2088724.5, Sep. 27, 2024.
Japanese Patent Office, Notice of Reasons for Refusal for JP Patent App. No. 2022-528218 dated Nov. 14, 2024.
Korean Intellectual Property Office, Notice of Non-Final Rejection for KR Patent App. No. 2022-7020393, Jun. 25, 2025.

* cited by examiner

DEVICE AND METHOD FOR CONTINUOUS SYNTHESIS OF GRAPHENE

TECHNICAL FIELD

The embodiments disclosed herein relate to production of graphene, and, in particular to methods and devices for continuous production of graphene.

INTRODUCTION

Graphene may be produced by conversion of a carbon source through joule heating. The carbon source is a carbon-based powder that is packed into a small quartz tube container and voltage is applied to each end of the powder material via metal (copper, copper wool, brass) electrodes. However, prior methods of synthesizing graphene produce several challenges in industrial applications and the method is not practical for mass production of graphene.

Further, the quartz tubes that may be used for joule heating are cost-inefficient because they are degraded and contaminated during the joule heating process when the carbon powder comes into contact with the quartz. The quartz tubes must be disposed after a single use, which may significantly increase the cost of producing graphene on an industrial scale. The copper wool that is used as an electrode is also degraded by the process, which further increases the costs for producing graphene. Use of metal electrodes, such as copper and brass, which make direct contact with the graphene may also add metal contaminants into the graphene powder that is produced. Prior devices for synthesizing graphene also needed to be assembled and unassembled inbetween converting different batches of graphene which prevented large scale, continuous graphene production.

Accordingly, there is a need for new cost efficient methods, products, and devices for producing graphene on an industrial scale. Methods, products, and devices of producing graphene which preserve the quartz used during synthesis may reduce costs. Further, products, methods, and devices are necessary to allow for continuous processing of materials necessary for producing graphene, thereby allowing for low-cost, industrial production of graphene.

SUMMARY

According to some embodiments, there is a device for synthesis of graphene. The device includes a container having a space for holding a carbon source. The container has an entry opening for receiving the carbon source material. The device includes at least two electrodes for applying an electrical current through the space for joule heating the carbon source. The space for joule heating the carbon source is between the at least to electrodes. The device also includes a movement component for moving the carbon source, with respect to the container, into the opening in a first direction and the at least two electrodes apply the electrical current in a second direction. The first direction is not the same as the second direction.

The device may also include an exit opening positioned relative to the at least two electrodes to allow for moving the graphene out of the space for joule heating the carbon source. The entry opening may be positioned relative to the at least two electrodes to allow for moving of the carbon source into the space for joule heating the carbon source while applying the electrical current.

The device may also include a power supply connected to the electrodes for passing the electrical current through the electrodes to convert at least part of the carbon source in the space for joule heating the carbon source into graphene.

The device may provide that the at least two electrodes are made from at least one of the group comprising copper, brass, stainless steel, and graphite.

The device may provide that the at least two electrodes have vents to allow for escape of gas when the electrical current is applied to the carbon source.

The device may provide that the space for joule heating the carbon source is surrounded by at least one quartz wall.

The device may provide that at least one of the at least two electrodes surrounds the space for joule heating the carbon source.

The device may provide that the at least two electrodes are resilient at high temperatures.

The device may provide that the at least two electrodes operate at temperatures between room temperature to 3200° C.

The device may also include pre-treatment electrodes for heating the carbon source to temperatures between 400° C.-800° C.

The device may provide that the at least two electrodes are configured to apply an electric current which heats the carbon source to temperatures between 2800° C.-3200° C.

The device may also include a carbon source reservoir for holding the carbon source prior to moving into the space for joule heating the carbon source.

The device may also include a graphene reservoir for collecting the graphene after moving out of the space for joule heating the carbon source.

The device may also include a compression component for compressing the carbon source.

The device may provide that compression component is a compression piston for compressing the carbon source.

The device may provide that the compression component is a compression corkscrew.

The device may provide that the electrode is at least one of the group comprising a ring electrode, a pin electrode, and a mesh electrode.

The device may provide that the at least two electrodes are positioned opposite to each other.

The device may provide that the at least two electrodes are positioned concentric to each other.

The device may provide that the electrical current is DC.

The device may provide that the electrical current is AC.

The device may provide that the electrical current is a combination of AC and DC.

Graphene may be produced by the device.

The graphene may be turbostratic graphene.

According to some embodiments, there is a device for synthesis of graphene. The device includes an inner electrode and an outer electrode. The device also includes a space for joule heating the carbon source for a carbon source between the inner electrode and the outer electrode. The inner electrode and outer electrode are positioned to radially apply an electrical current through the space for joule heating the carbon source. The device also includes an entry opening positioned relative to the inner electrode and outer electrode to allow for moving of the carbon source into the space for joule heating the carbon source. The device also includes a power supply connected to the inner electrode and outer electrode for passing the electrical current through the inner electrode and outer electrode to convert at least part of the carbon source in the space for joule heating the carbon source into graphene.

The device may provide that the outer electrode surrounds the space for joule heating the carbon source.

The device may also include a cooling component for cooling at least one of the group comprising the inner electrode and the outer electrode.

The device may provide that the electrical current is DC.

The device may provide that the electrical current is AC.

The device may provide that the electrical current is a combination of AC and DC.

According to some embodiments, there is a device for synthesis of graphene. The device includes a container for holding a carbon source. The container includes a first electrode. The device also includes a space for joule heating the carbon source for applying an electrical current between a second electrode and the first electrode. The carbon source is positioned between the first electrode and second electrode. The device also includes a movement component for moving of the container to the space for joule heating the carbon source. The device also includes a power supply connected to the first electrode and the second electrode for passing the electrical current through the electrodes to convert at least part of the carbon source into graphene.

The device may provide that the movement component is a conveyor belt.

According to some embodiments there is a method for synthesizing graphene. The method includes moving a carbon source in a first direction into a space for joule heating the carbon source in a first direction. The method also includes applying an electrical current in a second direction to the carbon source with at least two electrodes positioned to allow movement of the carbon source into the space for joule heating the carbon source while applying the electrical current. The first direction and the second direction are not the same.

The method may provide that applying an electric current to the carbon source includes applying a first electrical current to the carbon carbon source at a lower voltage for removing moisture and volatile materials from the carbon source. Applying an electric current to the carbon source may also include applying a second electrical current to the carbon source at a higher voltage for converting the carbon source to graphene.

The method may provide that the lower voltage heats the carbon source to a temperature of between 400° C.-800° C.

The method may provide that the electrical current is applied for between 50 milliseconds to about 1 second.

The method may provide that the higher voltage heats the carbon source between 2800° C.-3200° C.

The method may also include compressing the carbon source.

The method may provide that the carbon source is compressed using a compression piston.

The method may provide that the carbon source is compressed using a compression corkscrew.

The method may also include removing unconverted carbon from the graphene.

The method may provide that the carbon source is moved using a compression piston.

The method may provide that the carbon source is moved using a conveyor belt.

The method may provide that the at least two electrodes are positioned opposite to each other.

The method may provide that the at least two electrodes are positioned concentric to each other.

The method may provide that the electrode is at least one of the group comprising a ring electrode, a pin electrode, and a mesh electrode.

The method may provide that the movement of the carbon source into the space for joule heating the carbon source is continuous.

The method may provide that the movement of the carbon source into the space for joule heating the carbon source is in batches.

The method may provide that the electrical current is DC.

The method may provide that the electrical current is AC.

The method may provide that the electrical current is a combination of AC and DC.

Graphene may be produced from the method.

The graphene of may be turbostratic graphene.

According to some embodiments, there is a device for synthesis of graphene. The device includes a container having a space for holding a carbon source, wherein the container has an entry opening for receiving the carbon source. The device also includes at least two ring electrodes for applying an electrical current through the space for joule heating the carbon source. The space for joule heating the carbon source is between the at least to ring electrodes. The device also includes a movement component for moving the carbon source, with respect to the container, into the entry opening in the same direction as the at least two ring electrodes apply the electrical current.

The device of may also include an exit opening positioned relative to the at least two ring electrodes to allow for moving the graphene out of the space for joule heating the carbon source. The entry opening may be positioned relative to the at least two electrodes while applying the electrical current to allow for moving of the carbon source into the space for joule heating the carbon source.

The device may also include a power supply connected to the electrodes for passing the electrical current through the at least two ring electrodes to convert at least part of the carbon source in the space for joule heating the carbon source into graphene.

The device may provide that the at least two electrodes are made from at least one of the group comprising copper, brass, stainless steel, and graphite.

The device may provide that the at least two electrodes include vents for escape of gas when the electrical current is applied to the carbon source.

The device may provide that the space for joule heating the carbon source is surrounded by at least one quartz wall.

The device may provide that the at least two ring electrodes are resilient at high temperatures.

The device may include pre-treatment ring electrodes for heating the carbon source to temperatures between 400° C.-800° C.

The device may provide that the at least two electrodes are configured to apply an electric current which heats the carbon source to temperatures between 2800° C.-3200° C.

The device may include a carbon source reservoir for holding the carbon source prior to moving into the space for joule heating the carbon source.

The device of may include a graphene reservoir for collecting the graphene after moving out of the space for joule heating the carbon source.

The device may provide that the movement component compresses the carbon source.

The device may provide that the movement component is a compression corkscrew.

The device may include a compression component for compressing the carbon source.

According to some embodiments, there is a method for synthesizing graphene. The method includes moving a carbon source in a first direction into a space for joule heating the carbon source. The method also includes applying an electrical current in second direction to the carbon source with at least two ring electrodes positioned to allow movement of the carbon source into the space for joule heating the carbon source. The first direction and the second direction are the same.

The method may provide that applying an electric current to the carbon source includes applying a first electrical current to the carbon carbon source at a lower voltage for removing moisture and volatile materials from the carbon source. The method may also include applying a second electrical current to the carbon source at a higher voltage for converting the carbon source to graphene.

The method may provide that the lower voltage heats the carbon source to a temperature of between 400° C.-800° C.

The method may provide that the electrical current is applied for between 50 milliseconds to about 1 second.

The method may provide that the higher voltage heats the carbon source between 2800° C.-3200° C.

The method may also include compressing the carbon source.

The method may provide that the carbon source is compressed using a compression piston.

The method may provide that the carbon source is compressed using a compression corkscrew.

The method may also include removing unconverted carbon from the graphene.

The method may provide that the carbon source is moved using a compression piston.

The method may provide that the carbon source is moved using a conveyor belt.

The method may provide that the at least two electrodes are positioned opposite to each other.

The method may provide that the movement of the carbon source into the space for joule heating the carbon source is continuous.

The method may provide that the movement of the carbon source into the space for joule heating the carbon source is in batches.

The method may provide that the electrical current is DC.

The method may provide that the electrical current is AC.

The method may provide that the electrical current is a combination of AC and DC.

Graphene may be produced from the method.

The graphene may be turbostratic graphene.

Other aspects and features will become apparent, to those ordinarily skilled in the art, upon review of the following description of some exemplary embodiments.

BRIEF DESCRIPTION OF THE DRAWINGS

The drawings included herewith are for illustrating various examples of articles, methods, and apparatuses of the present specification. In the drawings.

DETAILED DESCRIPTION

Figure 1:
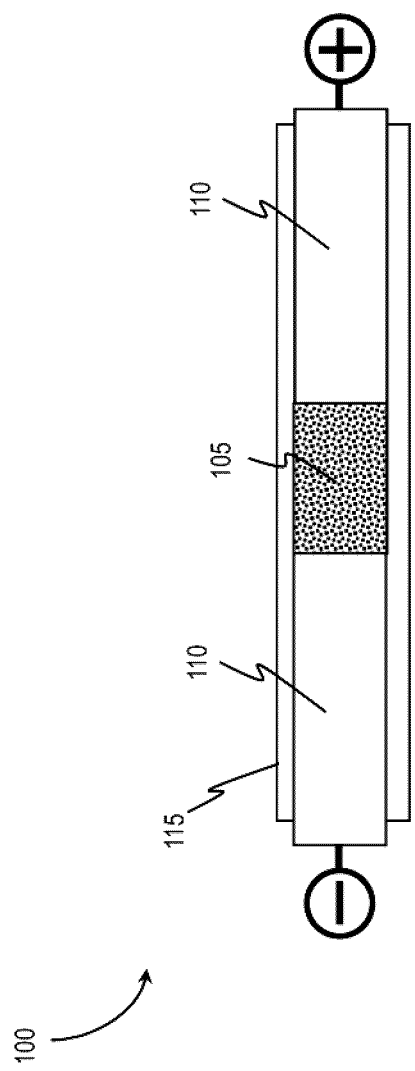
FIG. 1 illustrates a diagram of a device for producing graphene in a laboratory setting, according to an embodiment.

Various apparatuses or processes will be described below to provide an example of each claimed embodiment. No embodiment described below limits any claimed embodiment and any claimed embodiment may cover processes or apparatuses that differ from those described below. The claimed embodiments are not limited to apparatuses or processes having all of the features of any one apparatus or process described below or to features common to multiple or all of the apparatuses described below.

Provided herein is a device and method for continuous synthesis of a graphene from a carbon source through joule heating.

The term "graphene" refers to a material which is a one-atom-thick planar sheet of $sp^2$-bonded carbon atoms that are densely packed in a honeycomb crystal lattice, and, further, contains an intact ring structure of carbon atoms and aromatic bonds throughout at least a majority of the interior sheet and lacks significant oxidation modification of the carbon atoms. Graphene is distinguishable from graphene oxide in that it has a lower degree of oxygen containing groups such as OH, COOH and epoxide. The term "a graphene monolayer" refers to graphene that is a single layer of graphene. The term "a very few layer graphene" refers to a graphene that is between 1 to 3 layers of graphene. The term "a few layer graphene" refers to a graphene that is between 2 to 5 layers of graphene. The term "a multilayer graphene" refers to a graphene that is between 2 to 10 layers of graphene.

The term "turbostratic graphene" refers to a graphene that has little order between the graphene layers. Other terms which may be used include misoriented, twisted, rotated, rotationally faulted, and weakly coupled. The rotational stacking of turbostratic graphene helps mitigate interlayer coupling and increases interplanar spacing, thereby yielding superior physical properties relative to competitive graphene structures when compared on a similar weight basis. The subtle difference in adjacent layer stacking orientation expresses itself with important differences in product performance attributes. An important performance benefit evident with turbostratic graphene is that multi-layer graphene structures separate into few and individual graphene layers more easily and the graphene layers tend not to recouple. The turbostratic nature of a graphene may be observed and confirmed by Raman spectroscopy, Transmission Electron Microscopy (TEM), selected area electron diffraction (SAED), scanning transmission electron microscopy (STEM), and X-ray diffraction (XRD) analysis.

The term "opening" generally refers to any passage from which a carbon source or graphene may be passed through to enter or exit a space for joule heating the carbon source of a device for synthesizing graphene. The opening may include any an unobstructed entrance or exit. For example, an "entry opening" may be any entry point for moving a carbon source or graphene into a space for joule heating the carbon source of a device for synthesizing graphene. An "exit opening" may be any exit point used for moving a carbon source or graphene out of a space for joule heating the carbon source of a device for synthesizing graphene.

The term "carbon source" generally refers to any carbon-based material which may be converted into a graphene material, preferably turbostratic graphene. The carbon source may be in any form including in a powder form, or in a compressed pill form. The carbon source may include, without limitation, petroleum coke, tire carbon black, carbon black, metallurgical coke, plastic ash, plastic powder, ground coffee, anthracite coal, coal, corn starch, pine bark, polyethylene microwax, wax, chemplex 690, cellulose, naptenic oil, asphaltenes, gilsonite, and carbon nanotubes.

In some embodiments, the devices, methods, and products provided herein may provide for continuous synthesis of graphene, wherein a carbon source is moved into a space for joule heating and converted to graphene and simultaneously moved out in a continuous manner. In some embodiments, the joule heating may be conducted in batches, wherein a first batch carbon source is moved into the joule heating space, the carbon source is converted to graphene, the carbon source is moved out of the joule heating space, and a new batch carbon source is moved into the joule heating space and the process is repeated. The joule heating in batches may be partial or full batches. In some embodiments, multiple partial batches may be moved into the joule heating space prior to moving out all of the batches. Similarly, multiple partial batches may be moved out of the joule heating space prior to moving in another batch.

A flash joule heating synthesis method and compositions thereof are described in Patent Cooperation Treaty Application having International Publication Number WO 2020/051000 A1 to Tour et al., having an international publication date of Mar. 12, 2020, which is herein incorporated by reference in its entirety.

A method of synthesizing graphene by joule heating a carbon pill and compositions thereof are described in Patent Cooperation Treaty Application having International Application Number PCT/CA2020/051368 to Mancevski, having an international application date of Oct. 13, 2020, which is herein incorporated by reference in its entirety.

Referring to FIG. 1, illustrated therein is a diagram of a device for producing graphene in a laboratory setting, according to an embodiment. The device 100 for graphene synthesis consists of a mechanical assembly which includes a container 115 (for example a quartz tube) 115, a the carbon source 105, and electrodes 110 which may be made of copper wool or graphite. The mechanical assembly also includes compression pistons/screws and a protective enclosure which are not shown in FIG. 1. The device also includes an electrical assembly for providing an electrical current to the electrodes. The electrical assembly includes a power supply, a capacitor bank, high power switches, and a controller which are not shown in FIG. 1. The electrodes 110 make direct contact with the carbon source 105. The carbon source 105 also makes contact with the quartz tube 115 wall, which causes the quartz tube 115 to degrade after the joule heating process. The joule heating current is up between 800 and 2500 Amperes. Due to they direct contact with the carbon source and the electrodes 110, if the electrodes 110 are made from brass or copper, they may partially melt during the joule heating process and introduce imourities not the graphene.

The device 100 of FIG. 1 may produce a batch of 1 g of graphene every ~15 min or 30 g/day from a variety of carbon sources. The quartz tube 115 has a 15 mm inner diameter (ID) with a carbon volume of ~5 cc. The joule heating process consists of loading the carbon powder into the quartz tube 115. The process also includes plugging each of the quartz tube 115 ends with a layer of electrodes 110. The process also includes compressing the carbon source with screws. Joule heating is performed for between 10 ms to 100 ms, and unloading the resulting graphene from the tube. In a laboratory setting this process is manual and takes about 15 min per batch. Most of the process time is overhead while the actual carbon-to-graphene process time is only 10 ms-150 ms. The energy required to convert carbon to graphene is 4 Wh/g (14.4 kJ/g) for fully discharging the joule heating process for 100 ms. Some of the energy is wasted because of the limiting speed of the high-power electronics.

Figure 2:
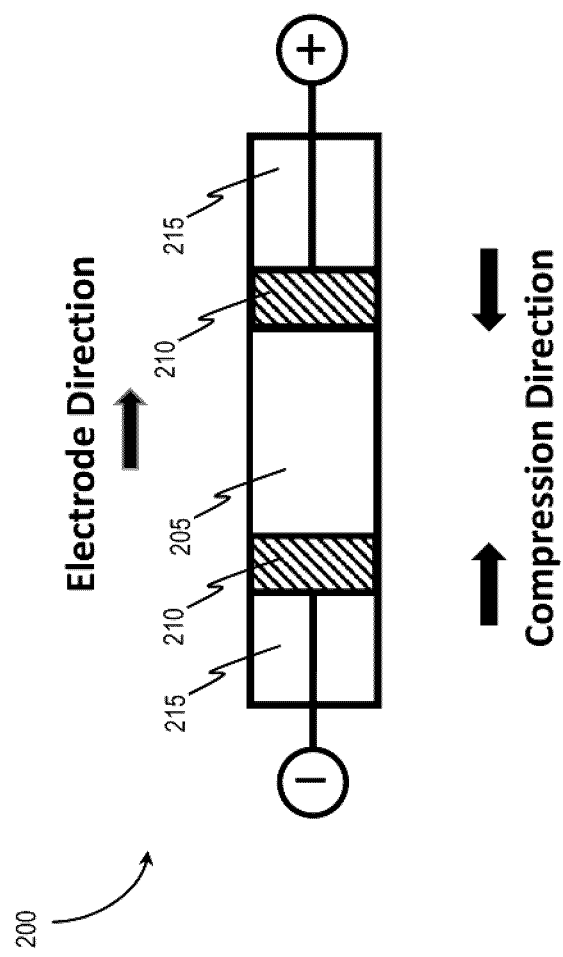
FIG. 2 illustrates a diagram indicating the directions of compression and electrode of a device for producing graphene in a laboratory setting, according to an embodiment.

Referring to FIG. 2, illustrated therein is a diagram indicating the directions of compression and electrode of a device for producing graphene in a laboratory setting, according to an embodiment. The direction of the electrodes 210 and the compression direction are predominately aligned. The carbon source 205 is compressed on both ends by the electrodes 210. An advantage of the design shown in FIG. 2 is the possibility to use of standard round quartz tube 215, the light emitted during joule heating (via radiation cooling process) of the carbon source 205 may exit through the quartz tube 215 to allow for reduced cooling times and gasses exit through the copper wool 210. The device 200 results in very little loss of graphene material during handling. The device 200 also has disadvantages such as requiring disassembly to remove the graphene. Further, the graphene gets stuck to the copper and the copper wool particles end up mixed with graphene. In addition, the quartz tube 215 gets contaminated with each use.

Figure 3:
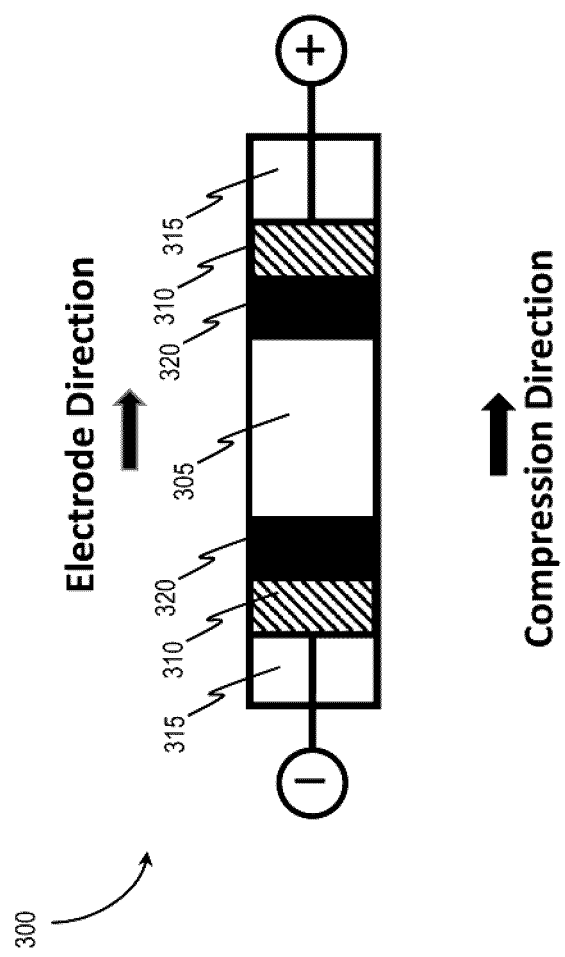
FIG. 3 illustrates a diagram indicating the directions of compression and electrode of a device with graphite disks for producing graphene in a laboratory setting, according to an embodiment.

Referring to FIG. 3, illustrated therein is a diagram indicating the directions of compression and electrode of a device with graphite disks for producing graphene in a laboratory setting, according to an embodiment. To overcome the disadvantages of the device 200 of FIG. 2, a porous graphite plug or disk 220 is placed as the electrode component in direct contact to the carbon source 305. Another plug made of copper wool 310 may optionally be added on each side of the graphite 320, the graphite side that is not in contact with the carbon source. Then the copper wool 310 may be contacted by copper or brass rods that are connected to a DC power source such as a battery or capacitor or an AC power source. The carbon source 305 is compressed from one side in plane with the direction of the electrode. In some embodiments, the compression may by from both sides in plane with the direction of the electrode.

The advantages of the device 300 is the possibility of using a standard round quartz tube 315, the light emitted (radiation cooling) when joule heating the carbon source 305 may exit through quartz tube 315 to reduce cooling times and gasses may exit through the porous graphite and the copper wool. Furthermore, if the graphite is not porous, the process gasses may exit from the gap between the graphite plug and the inner diameter of the quartz tube. Further, the loss of material during handling is low using the device 300. In addition, the graphene that is synthesized after the carbon source 305 is exposed to high temperatures of 2800° C. to 3200° C. and does not stick to the graphite plugs, or if the synthesized graphene does stick, the synthesized graphene may be easily removed from the graphite 320.

In some embodiments, the methods, devices, and products increase the batch size from 1 g to 10 g. Increase of the batch size directly increases the scale of the manufacturing process. The existing laboratory setup uses a quartz tube with a 15 mm ID and ~25 mm tube length, with a carbon mass of 1 g/batch, volume of ~5 cc/batch. Due to the resistive Joule heating nature of the load, doubling the tube diameter requires increasing the current by 4× with no changes in the voltage demand. Doubling the tube length requires an increase of the voltage by 2× with no changes in the current demand. Therefore, the batch size may be limited by the available switch electronics. Typical insulated-gate bipolar transistor (IGBT) high power switching modules, commonly used for motor drives, uninteruptible power supply (UPS) systems, and solar inverters have voltages of up to 1700V and currents up to 1800 A that allow for the flexible design of the reaction tube. Multiple IGBT switches, operating in parallel, may be used to enable currents up to 5000 A or more. The implication is that it is not practical to design a batch larger than 10 g. The scaling may be done by increasing the frequency (turn-around time) of each batch.

In some embodiments, the methods, devices, and products provided herein achieve a batch size of 5 g per batch (volume of ~24 cc/batch) which equates to a production of 1 kg/day. This may be achieved with a quartz tube having 20 mm ID and ~75 mm tube length. The conversion power for 5 g is ~110 kW/g (1500 A and 750 V). Since the power is supplied by a bank of capacitors having a linear voltage discharge, the average voltage used for energy computations is ½ of the maximum voltage. In some embodiments, a batch size of 10 g per batch (volume of ~48 cc/batch) may be possible, which allows for commercial production with the addition of automation and parallel production lines that will enable a production of 1 Ton/h (8 Ton/day). 10 g per batch may be achieved with a quartz tube having 20 mm ID and ~150 mm tube length. The conversion power for 10 g is ~110 kW/g (1500 A and 1500V).

Referring to Table 1, a summary of device parameters for three different embodiments are shown with each allowing for larger scales of production. Embodiment 1 allows for the lowest scale of production of graphene. Embodiment 2 allows for larger scale production that Embodiment 1. Embodiment 3 allows for the largest scale production of the three embodiments and allows for industrial scale production.

TABLE 1

Device Parameters for Scaling Graphene Production.

| Parameter | Embodiment 1 | Embodiment 2 | Embodiment 3 |
| --- | --- | --- | --- |
| Process Tube ID (cm) | 1.5 | 2 | 2 |
| Process Tube Area (cm$^2$) | 1.77 | 3.14 | 3.14 |
| Process Tube Length (cm) | 2.7 | 7.5 | 15.2 |
| Process Volume (cc) | ~5 | ~24 | ~48 |
| Graphene Produced (g) | 1 | 5 | 10 |
| Process Current (A) | 500 | 1500 | 1500 |
| Process Voltage (V) | 250 | 750 | 1500 |
| Switch Module | mech, relay | IGBT | IGBT |
| Switch Specifications | 900 V, 500 A, 25 ms | 1000 V, 1600 A, 10 μs | 1600 V, 1600 A, 10 μs |

In some embodiments, the methods, devices, and products provided herein decrease the process time (turn-around time) of each batch process for graphene synthesis. The decrease in process time relates directly with increases in the scalability of graphene production. With the devices of FIGS. 1, 2, and 3, the graphene synthesis process takes 15 min per batch of 1 g. Most of the process time is overhead while the actual carbon-to-graphene process time is only 10 ms-150 ms. The rest of the time is consumed with manual carbon loading, manual compression of the carbon powder, and manual graphene unloading. Using the devices in FIGS. 1, 2, and 3, 30 batches of 1 g of carbon source may produce 30 g of graphene per day.

Production of 1 kg of graphene per day may be achieved with 200 batches of 5 g each. Assuming an 8 hour production day, production of 200 batches requires a budget of 2 min per batch. With a throughput of 2 min, the graphene synthesis process may be operated in a semi-batch mode where 10 or more batches are loaded at the same time and 5 g of carbon are undergo a joule-heating process in sequence without the need to load and unload.

Similarly, production of 1 Ton/h may be achieved with 100,000 batches per hour, with each batch being 10 g each. Implementing 40 parallel production lines means that each production line needs to produce 20,000 batches per day, or 2500 batches of 10 g each per hour, assuming an 8 hour production day. Production of 2500 batches per hour requires a budget of 1.4 seconds per batch. The demand clearly requires a level of automation where the carbon is fed and removed into the process tube in a continuous manner while 10 g of carbon are joule-heated each 1.4 seconds without the need to load and unload. Alternatively, use of 100 parallel production lines is another reasonable possibility that increases the time budget to 3.6 seconds.

Referring to Table 2, a summary of production parameters for the three embodiments of Table 1.

TABLE 2

Production Parameters for Scaling Graphene Production.

| Parameter | Embodiment 1 | Embodiment 2 | Embodiment 3 |
| --- | --- | --- | --- |
| Batch Size (g) | 1 | 5 | 10 |
| No. Batches Per Day | 30 | 20 | 800,000 |
| Parallel Process Lines | 1 | 1 | 40 |
| No. Batches Per Line | 30 | 200 | 20,000 |

TABLE 2-continued

Production Parameters for Scaling Graphene Production.

| Parameter | Embodiment 1 | Embodiment 2 | Embodiment 3 |
| --- | --- | --- | --- |
| Process Time Per Batch (sec) | 960 | 144 | 1.4 |
| Process Time Per Batch (min) | 16.0 | 2.4 | 0.02 |

In some embodiments, the methods, devices, and products allow for a continuous process of graphene manufacturing. A continuous graphene synthesis method has the ability to load and unload the carbon powder in a continuous manner. A continuous graphene synthesis method also has the ability to compress the carbon powder independently from the loading and unloading. A continuous graphene synthesis method also has the orientation of the electrodes being independent from the direction of the carbon source flow. The continuous graphene synthesis method also has the availability of vent holes/pores so as to allow fast evacuation of hot gasses created as a result of the joule heating process. Also, there is a need to vent the reactor during the joule heating process so that thermal and electrodynamic forces do not compress the carbon source.

Figure 4:
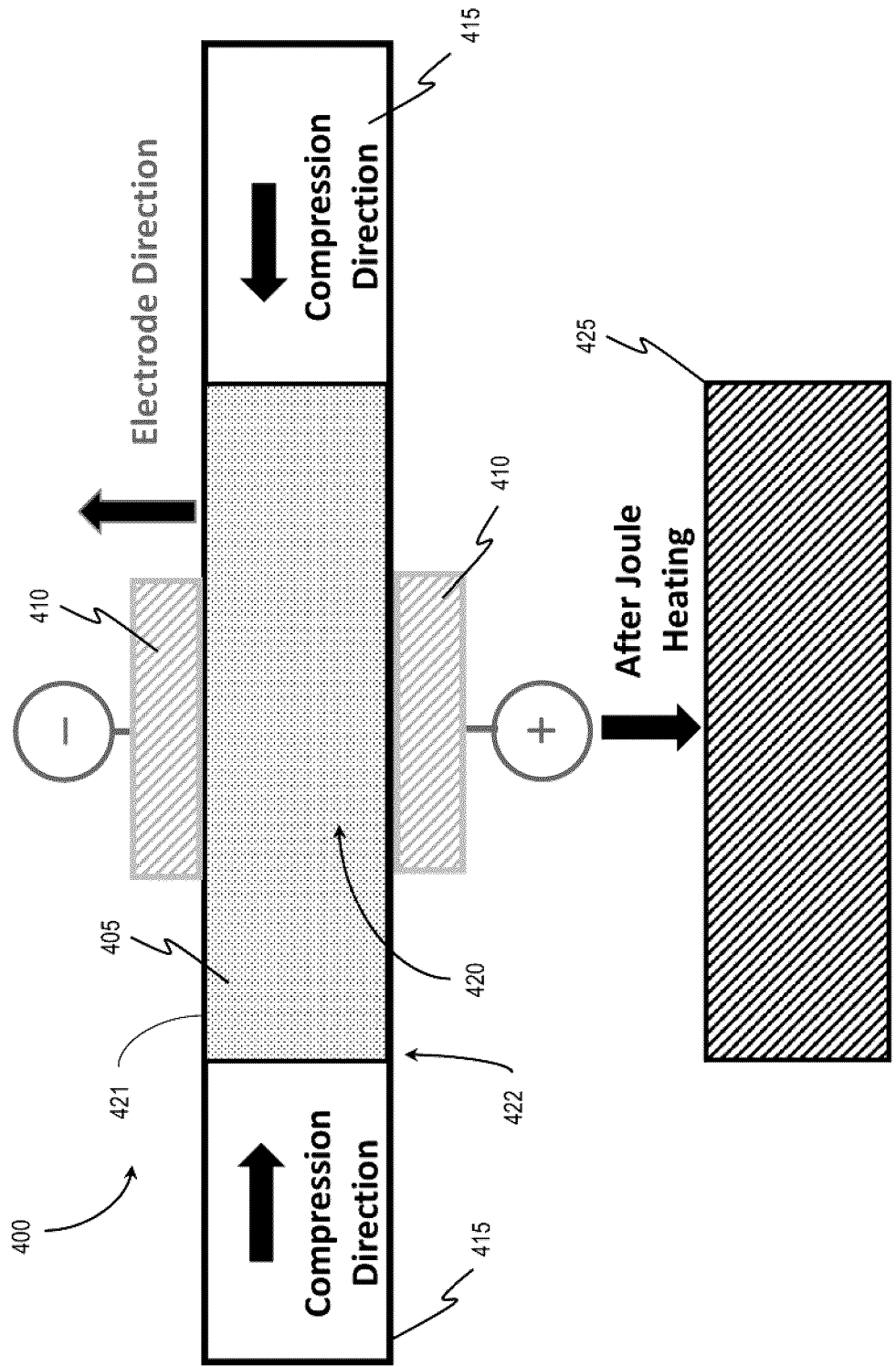
FIG. 4 illustrates a diagram of a device for continuous and batch synthesis of graphene, according to an embodiment.

Referring to FIG. 4, illustrated therein is a diagram of a device for continuous synthesis of graphene, according to an embodiment. The device 400 allows for scaled production of graphene. The electrodes 410 are perpendicular to the carbon source 405 compression direction by the pistons 415. As the carbon source 405 is pushed into the space for joule heating the carbon source 420, which is right between the electrodes 410, the carbon source may be joule heated to form graphene 425. As new carbon powder is pushed into the entry opening 422 of the container 421 and into the space for joule heating the carbon source 420, the resulting graphene 425 produced from the joule heating of the carbon source 405 may be expunged to the side opposite of where the new carbon source 405 is inserted. In some embodiments, there is no piston or other object on the exiting side of the tube as the carbon-tube friction will play the role of stopping the carbon from flowing and allowing joule heating to be commenced.

An advantage of the device 400 of FIG. 4 is that the device enables continuous carbon source 405 and graphene 425 flow. The device 400 also does not need to be disassembled to insert the carbon source 405 or remove the graphene 425. Further, the graphene does not stick to the graphite electrodes 410. Low loss of graphene material occurs during handling.

In some embodiments, the device for continuous synthesis of graphene includes a second set of electrodes for independent pre-treatment of the carbon source. The secondary set of electrodes, located left of the primary set of electrodes 410, are used to pretreat the carbon at lower temperatures, between 400° C. to 1000° C. to carbonize the carbon source, remove moisture, volatiles, and any other substances that evaporate at these temperature ranges. After the carbon source is pre-treated the carbon source 405 is pushed towards the primary electrodes 410 were the carbon source 405 is joule heated and converted into graphene. The process tube may be any size, including without limitation round or rectangular. The process tube may be made of, without limitation, quartz or ceramic. The force needed to move large segments of graphene has be too large enough to move the carbon source.

Figure 5:
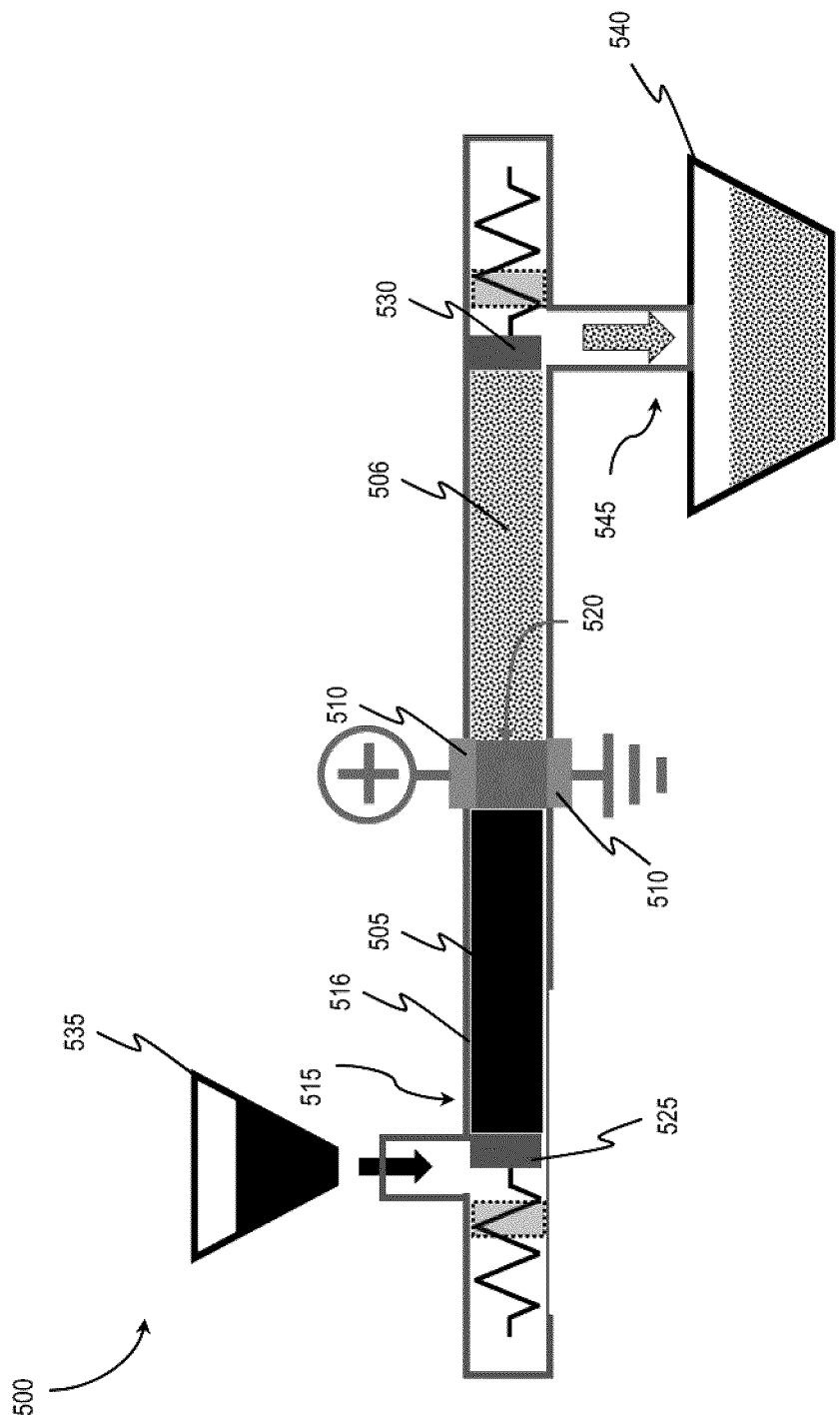
FIG. 5 illustrates a diagram of a device for continuous and batch graphene synthesis utilizing a piston-like action, according to an embodiment.

Referring to FIG. 5, illustrated therein is a diagram of a device for continuous graphene synthesis utilizing a piston-like action, according to an embodiment. The device 500 allows for scaled production of graphene. The device 500 includes a movement component 525 for moving the carbon source 505 into the entry opening 515 of the container 516. The movement component is also for compressing the carbon source 505 and pushing the carbon source 505 towards the space for joule heating the carbon source 520. The device 500 also includes a carbon source reservoir 535 for holding the carbon source 505 before the carbon source moves into the entry opening 515. The electrical current is not in the same direction as the compression of the carbon source 505. The electrical current is preferably perpendicular or close to perpendicular to the flow of carbon source 505, however it may be in any direction which is not the same direction as the direction of compression. The flow of carbon 505 may be continuous and the electrodes 510 do not prevent the flow of the carbon source 505. After the carbon source 505 is joule heated, the carbon source 505 is converted to graphene powder 506 that follows the flow path of the carbon source 505. The converted graphene 506 moves out of the exit opening 545 and into a graphene reservoir 540. Alternatively, pistons 525 and 530 may be replaced by a corkscrew or extrusion screws that rotate continuously instead of moving in forward-backward strokes.

The device 500 of FIG. 5, may be constructed with oval or rectangular cross section quartz or ceramic tubes (~150× 150 mm), in which there are cutouts for the parallel plate electrodes (~150×18 mm) in the mid-section of the tube. Alternatively, the electrodes may be curved to match the radius of curvature of the inlet and outlet conduits. The volume between the electrodes needs to fit 24 cc (5 g) or 48 cc (10 g) in accordance to the dimensions from Table 1. Unlike the device for producing graphene in a laboratory setting from FIG. 3, the function of the compression pistons 525, 530 and the electrodes 510 in FIG. 5 is carried out by separate components. The electrodes 510 may be made from, without limitation, copper, stainless steel, graphite or tungsten. The electrodes 510 are attached to the quartz but have vent holes to enable escape of the hot process gasses during the joule heating process. The compression pistons 525, 530 may be made of a dielectric material, such as quartz or ceramic, to prevent shorting to the piston's ground. The carbon source 505 is fed through a carbon source reservoir 535 into the entry opening 515 of the process tube. The movement of the carbon source is aided by a shaker while the first compression piston is retracted to the left. After the carbon powder is dispensed in the tube, the first compression piston 525 moves with enough stroke to displace the converted carbon 506 from the space for joule heating the carbon source underneath the electrodes while at the same time the second compression piston retracts to the right to allow for the graphene to be emptied into a collection bin. The movement is aided by a shaker or a vacuum suction. After the stroke is over, the second compression piston 530 pushes in to block the tube while the first compression piston 525 applies a predetermined pressure to the carbon source 505 until the joule heating process is done. The piston cycles need to match the throughput of the continuous process. The flow of carbon source 505 and graphene material 506 is in an enclosed environment that makes the operation safe.

Figure 6:
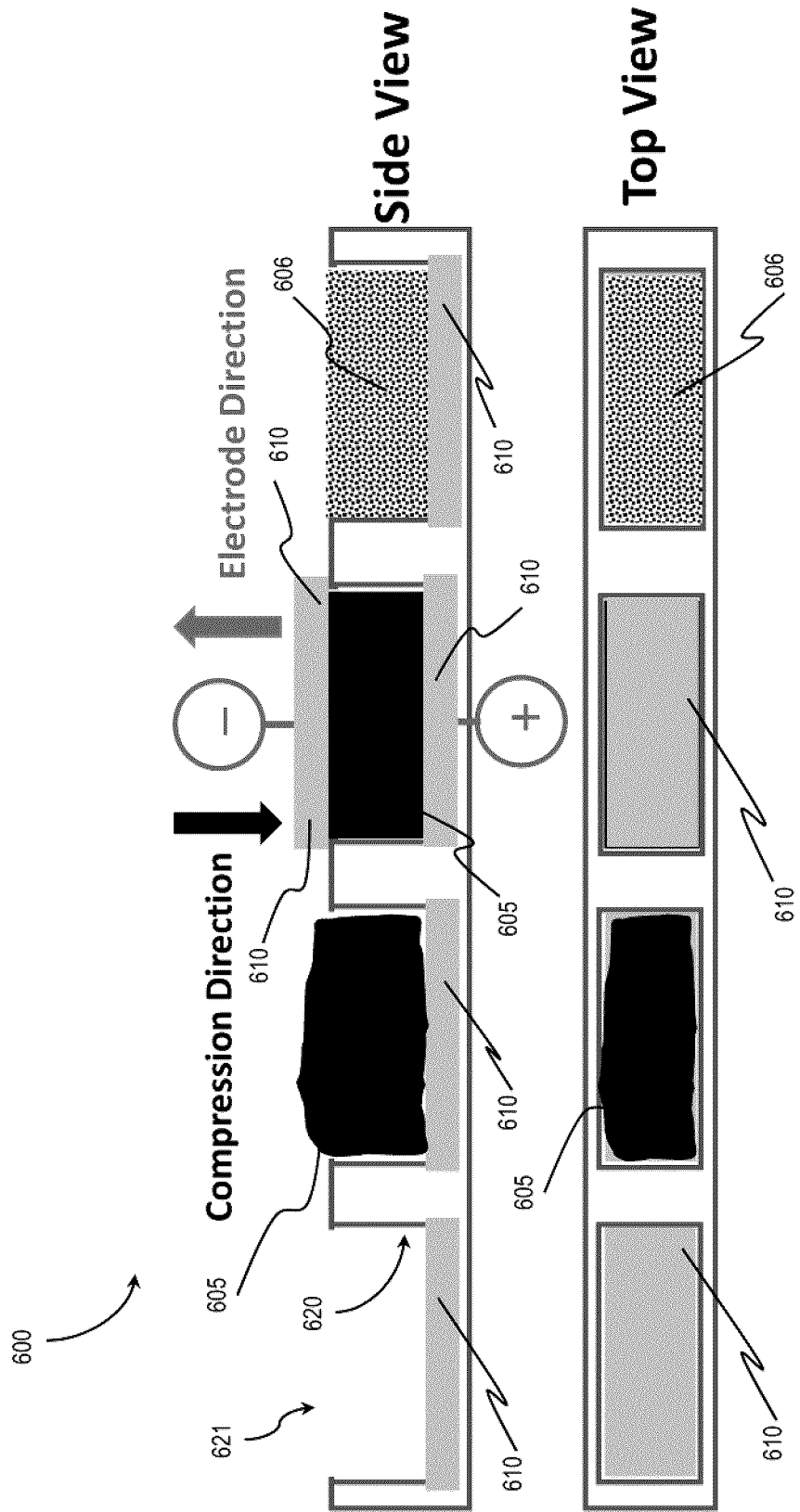
FIG. 6 illustrates a diagram of a side view and top view of a device for continuous and batch graphene synthesis utilizing containers and electrodes from the top and bottom of the container, according to an embodiment.

Referring to FIG. 6, illustrated therein is a diagram of a side view and top view of a device for continuous graphene synthesis utilizing containers and electrodes from the top and bottom of the containers 620, according to an embodiment. The device 600 allows for scaled production of graphene. In this embodiment, the container 620 is not a tube. Instead the carbon source 605 is loaded into containers 620 through the entry opening and the electrodes 610 are the top and bottom of the container 620.

Advantages of the device of FIG. 6 include that the device 600 enables continuous carbon source 605/graphene 606 flow. The device 600 does not need to be disassembled to insert the carbon source 605 or remove the graphene 606. The graphene 606 does not get stuck to the graphite electrodes 610 and the device 600 allows use of second set of electrodes 610 for independent pre-treatment of the carbon source 605. The secondary set of electrodes, located left of the primary set of electrodes 610 are used to pretreat the carbon source at lower temperatures between 400° C. to 1000° C. to carbonize the carbon source 605 and remove moisture, volatiles, and any other substances that evaporate at the pre-treatment temperature ranges. After the carbon source 605 is pre-treated the carbon source container 620 is moved under the primary electrodes 610 were the carbon source 605 is converted into graphene 606.

Figure 7:
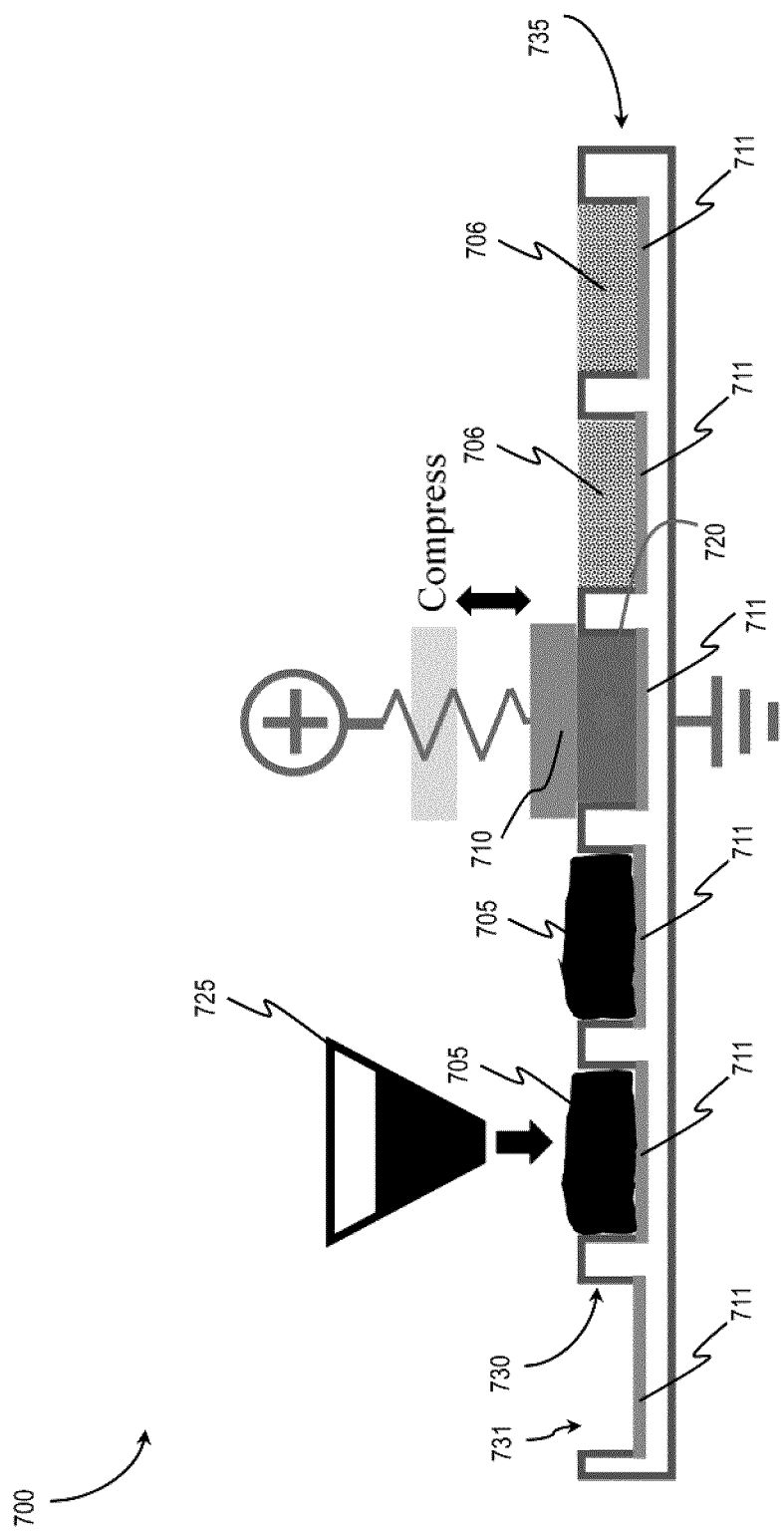
FIG. 7 illustrates a diagram of a device for continuous and batch synthesis of graphene utilizing a belt for graphene manufacturing through joule heating, according to an embodiment.

Referring to FIG. 7, illustrated therein is a diagram of a device for continuous synthesis of graphene utilizing a belt for graphene manufacturing through joule heating, according to an embodiment. The device 700 allows for scaled production of graphene. The carbon source 705 is fed through a reservoir 725 into the entry opening 731 of the quartz or ceramic container 730, having a metallic bottom electrode 711 that is grounded electrically, and is part of a continuous belt 735. The quartz container 730 may be a cylinder with diameter of 20 mm and depth of 150 mm, with a pitch of 50 mm between boats. The piston/electrode 710 is a cylinder with diameter of >20 mm to cover and seal the top surface of the boat. The piston/electrode 710 may be copper, steel, tungsten, or graphite. Vent holes are included in the electrode 710. The container 730 volume is 24 cc (5 g) or 48 cc (10 g) in accordance with the dimensions from Table 1. The container 730 is moved into the joule heating space 720 in a direction that is different than the direction the electrical current is applied by the electrodes 710, 711.

The dispersion of the carbon source 705 is loose until the container 730 reaches the space under the piston/electrodes 710 that compresses the carbon source 705 and applies joule heating to the carbon source 705 to convert the carbon source 705 in the container 730 into graphene 706. As the belt moves away from the space for joule heating the carbon source 720 the container 730 is emptied into a collection bin (not shown). The piston cycle is 2 minutes or 1.4 seconds to match the throughput of the continuous synthesis of graphene. The belt speed moves the next container under the electrode every 2 min or 1.4 s (depending on the desired scale). The entire device is enclosed to make the operation safe. The limiting step in the devices of FIGS. 6 and 7 is the speed of filling the container 730 with carbon source 705 from the reservoir 725.

Figure 8:
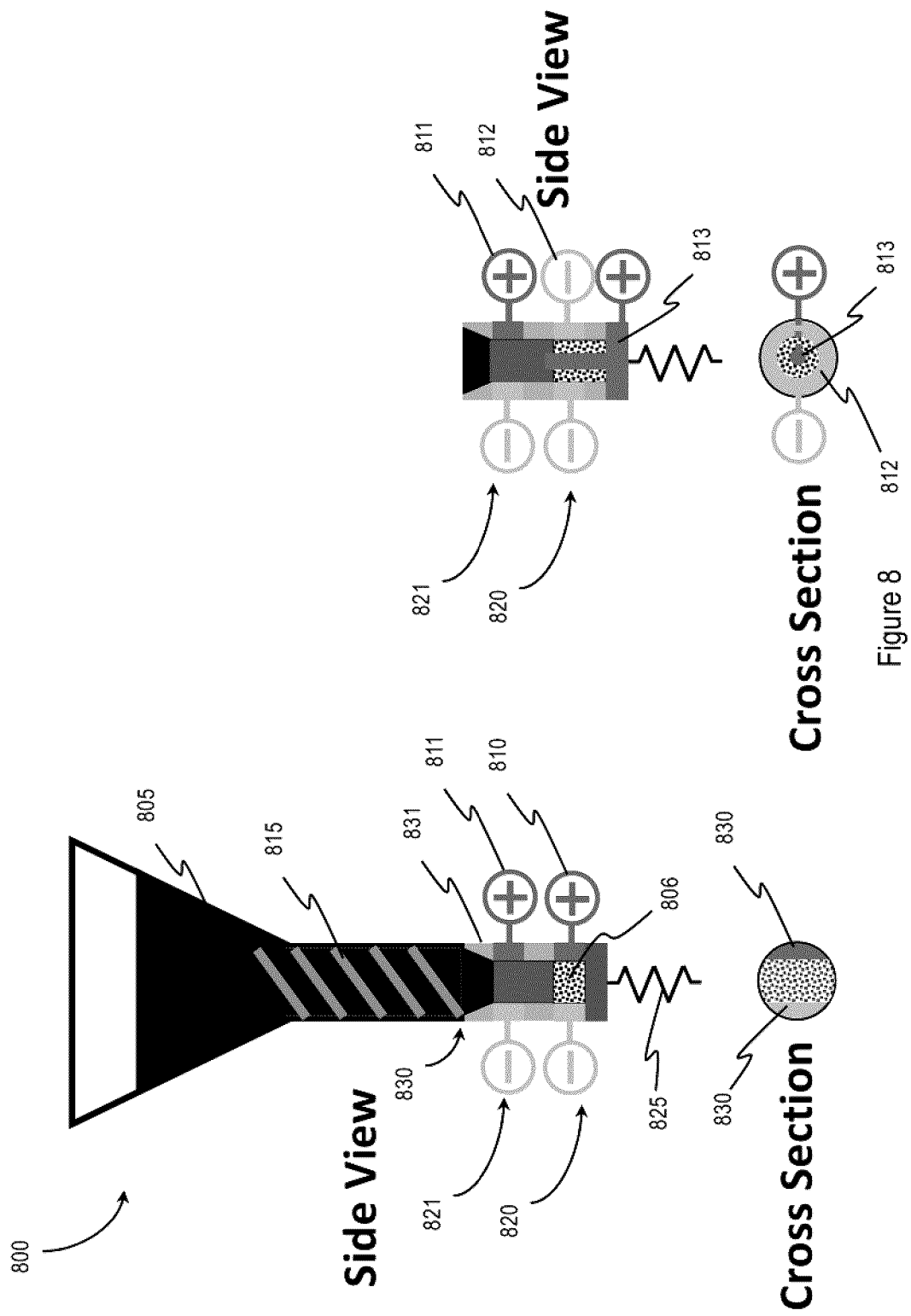
FIG. 8 illustrates a diagram of a side view of a device for continuous and batch synthesis of graphene utilizing corkscrew compression with split-ring electrodes being adjacent to the space for joule heating the carbon source, according to an embodiment.

Referring to FIG. 8, illustrated therein is a diagram of a side view of a device for continuous synthesis of graphene utilizing corkscrew or extrusion screw compression with split-ring electrodes being adjacent to the space for joule heating the carbon source, according to an embodiment. The device 800 allows for scaled production of graphene 806. The carbon source 805 is moved into the entry opening 830 of the container 831 which is the extrusion component and compressed by corkscrew compression 815. The corkscrew compression 815 pushes the carbon source 805 past two sets of electrodes 810, 811 positioned on the side of the flow tube where the pre-treatment space 821 and space for joule heating the carbon source 820 are. The electrodes are positioned perpendicular to the flow of carbon source. The corkscrew 815 may be a single corkscrew or a twin corkscrew mechanism. The electrodes 810, 811 are parallel plate 830 or opposing half-side electrodes 830 located opposite of each other at the same level of the extrusion component. A first set of electrodes 811 is used for pre-flashing the carbon source 805 and another set 810 for joule heating the carbon source 805. The pre-treated carbon source moves in the direction of the space for joule heating the carbon source 820 where the second set of electrodes 810 are positioned. An optional spring-loaded lid 825 may hold the graphene powder 806 until the graphene powder 806 is ready to be removed. The opening of the lid 825 is synchronized with the motion of the corkscrew 815. The electrical current is perpendicular to the flow of carbon source 805.

Alternative sets of electrodes 812, 813 may be used for the device 800 of FIG. 8. The ring electrode 813 may be used for one or more of the terminals with a pin electrode 812 used for at least one terminal. The cross section shows that the pre-treatment electrodes 811 at the pre-treatment space 821 are parallel opposing electrodes 830 and the joule heating electrodes 812, 813 are ring electrode 813 for the negative terminal and the pin electrode 812 for the positive terminal. The ring 813 and pin 812 electrodes are concentric and will joule heat the carbon source 805 in the space for joule heating the carbon source 820 between the pin and the ring.

Figure 9:
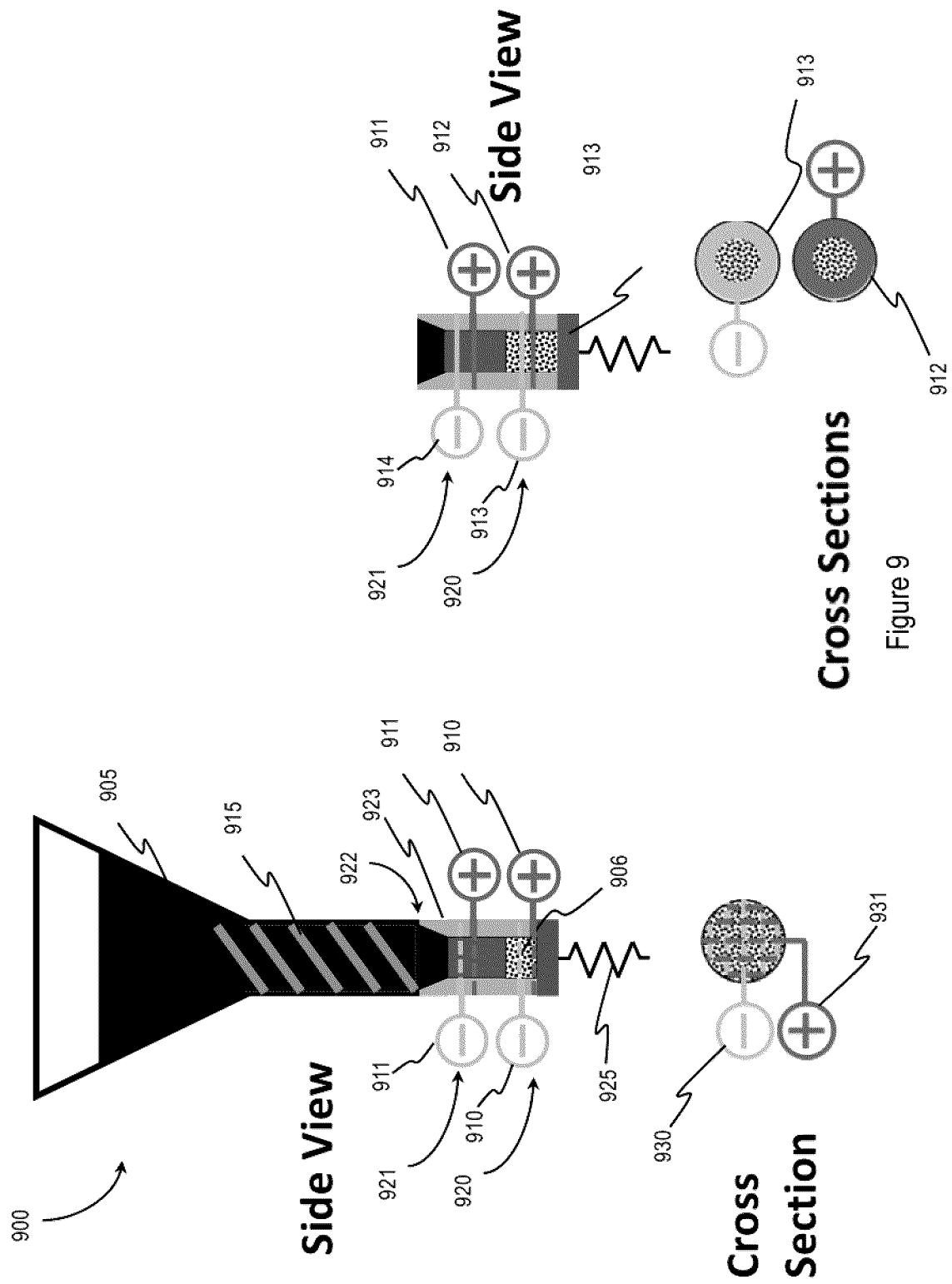
FIG. 9 illustrates a diagram of a device for continuous and batch graphene synthesis utilizing corkscrew compression with mesh-like and ring-like electrodes adjacent the space for joule heating the carbon source, according to an embodiment.

Referring to FIG. 9, illustrated therein is a diagram of a device for continuous graphene synthesis utilizing corkscrew compression with mesh-like and ring-like electrodes adjacent the space for joule heating the carbon source, according to an embodiment. The device 900 allows for scaled production of graphene 906. The carbon source 905 is inserted into a corkscrew mechanism 915 of an extruder-like machine that compresses the carbon source 905 and pushes the carbon source 905 past two sets of electrodes 911, 910 positioned upstream and downstream of the flow of carbon. The first set of electrodes 911 are mesh electrodes that allow flow of material but may also be energized and allow joule heating. The top mesh 930 is the ground electrode and the bottom electrode 931 is the positive electrode. The electrodes 930, 931 may also be positioned in the opposite orientation where the positive electrode 931 is the top mesh and the ground electrode 930 is the bottom electrode. The first set of electrodes 911 are for pretreating the carbon source 905 at the pretreating space 921. The second set of electrodes 910 are for joule heating the carbon source 905 at the space for joule heating the carbon source 920. An optional spring-loaded lid 925 may hold the graphene powder 906 until the graphene powder 806 is ready to be removed. The opening of the lid 925 is synchronized with the motion of the corkscrew 915. The electrical current is perpendicular to the flow of carbon source 905. The carbon source 905 is moved into the entry opening 922 of the container 923, which is the extrusion component.

In another embodiment, shown in FIG. 9, the electrodes 911, 912, 913, 914 are ring electrodes where the ground electrode 913 is the top electrode and the bottom electrode 912 is the positive terminal. The electrodes 911, 912, 913, 914 may also be positioned in the opposite orientation. The ring electrodes 911, 912, 913, 914 may be half ring, semi-pole rings, or quadrature-pole electrodes for more uniform distribution of the current flow though the sample. An optional spring-loaded lid 925 may hold the graphene powder 906 until the graphene powder 906 is ready to be removed. The opening of the lid 925 has to be synchronized with the motion of the corkscrew 915.

In both examples shown in FIG. 9, the carbon source 905 flows from top of the tube to the bottom of the tube and the electrical current flows in the direction of the carbon flow but has an open flow design so as not to interfere with the carbon powder flow.

Figure 10:
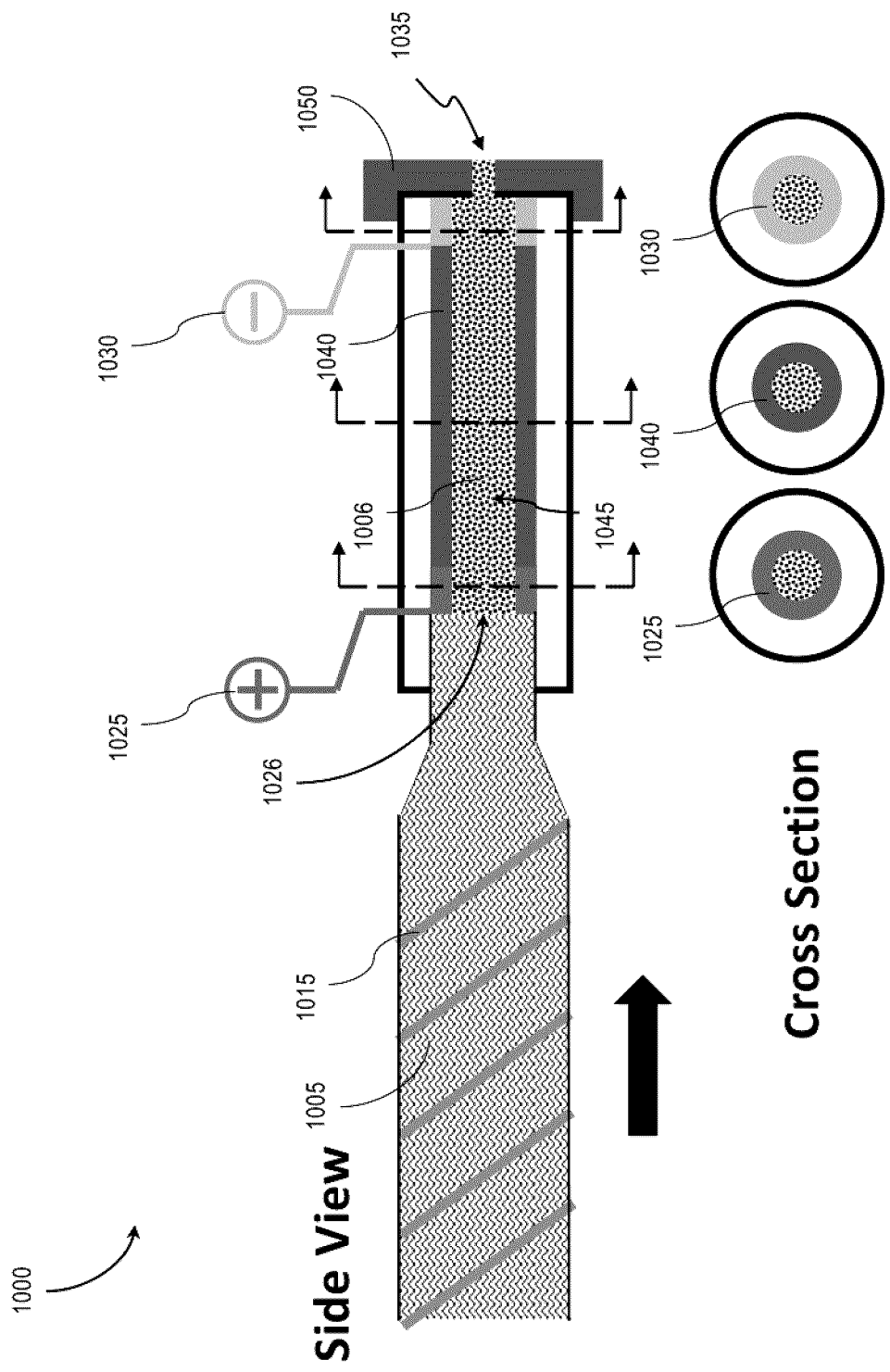
FIG. 10 illustrates a device for continuous and batch synthesis of graphene utilizing ring-like electrodes adjacent to the space for joule heating the carbon source, according to an embodiment.

Referring to FIG. 10, illustrated therein is a device for continuous synthesis of graphene utilizing ring-like electrodes adjacent to the space for joule heating the carbon source, according to an embodiment. The device 1000 allows for scaled production of graphene 1006. The carbon source 1005 is moved using an extruder like machine and the electrodes 1025, 1030 are ring electrodes located along the length of the compressed carbon source 1005 flow. One ring electrode 1030 is located right at the exit opening 1035 of the extruder and the other electrode 1025 is located further along the tube 1040 upstream of the carbon source 1005 flow adjacent the entry opening. In this embodiment, the tube 1040 is the container and the carbon source is moved into the entry opening 1026 of the tube in the same direction as electrical current from the ring electrodes 1025, 1030. The separation of the rings 1025,1030 determines the size of the space for joule heating the carbon source 1045. The electrical current flows from the inside ring of the first electrode 1025 to the inside ring of the second electrode 1030. During operation, the space for joule heating the carbon source 1045 between the electrodes is filled with carbon source 1005 and the joule heating of the carbon source 1005 is executed. The synthesized graphene 1006 in the space for joule heating the carbon source 1040 between the electrodes is removed through an exit opening 1035. A restricting orifice 1050 is added to the exit opening 1035 to prevent unwanted flow of graphene powder 1006. Additionally, the friction of the graphene powder 1006 in the tube 1040 prevents unwanted flow of graphene powder 1006. The flow of carbon source 1005 may be in full batches where the space for joule heating the carbon source between the electrodes 1045 is completely filled. The flow of carbon source 1005 may also be in semi batches, where only a fraction of the graphene 1006 is removed and the same fraction of carbon source 1005 is filled back. The flow of carbon source 1005 may also be continuous where the electrical discharge is periodic with respect to a continuous motion of the carbon source 1005 and graphene 1006.

Figure 11A:
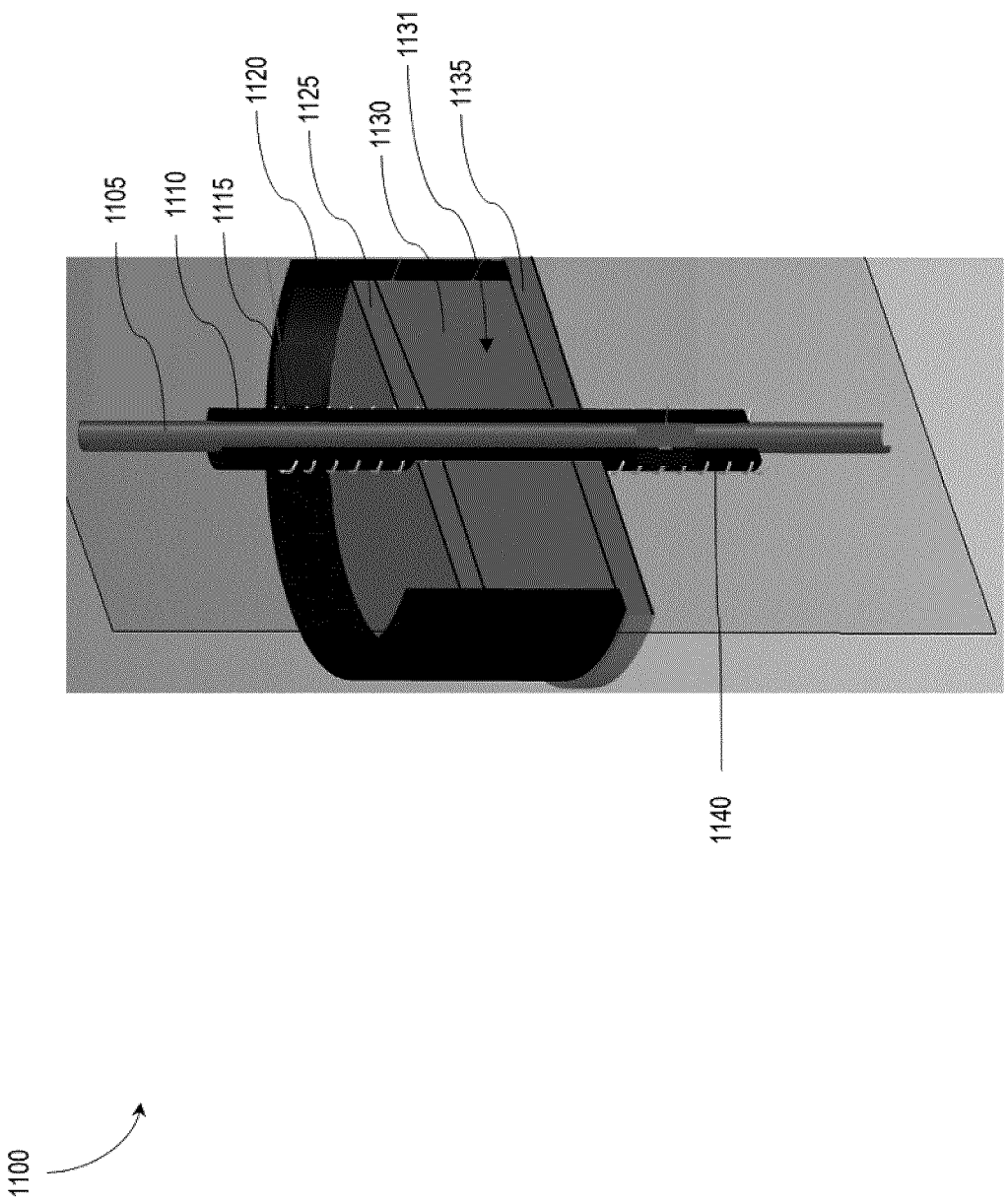
FIG. 11A is a diagram of a cross section view of a device for continuous and batch synthesis of graphene utilizing a radial electrode arrangement, according to an embodiment.

Referring to FIG. 11A, illustrated therein is a diagram of a cross section perspective view of a device for continuous synthesis of graphene utilizing a radial electrode arrangement, according to an embodiment. The device includes an inner electrode 1110 and outer electrode 1120, that are preferably made of graphite. The electrical potential of this device is in radial direction, originating from the outer surface of the inner electrode 1110 and terminating to the inner surface of the outer electrode 1120, or vice versa. The device 1100 includes an outer graphite electrode 1120 that acts as an electrode but also acts as a confinement tube to replace a quartz tube and may be cooled from the outside using conduction or convection cooling. The device may include a copper pipe 1105 having circulating coolant made from dielectric oil or similar dielectric liquid and a heat exchanger (not shown), where the copper pipe 1105 is inserted inside the hollow inner electrode 1110 for cooling the inner electrode 1110 and removing heat from the carbon source 1130. The device 1100 also includes a top spring 1115 to push the top quartz lid 1125 and compress the carbon source 1130 in space 1131 and a bottom spring 1140 to push the bottom quartz lid 1135 and compress the carbon source 1130 in space 1131. The carbon source 1130 is moved into the space for joule heating the carbon source 1131 to undergo conversion to graphene. The carbon source 1130 may be inserted and removed in a batch mode, where carbon source 1130 is inserted in the radial space 1131, is joule heated to convert to graphene, and removed from the radial space 1131. The carbon source 1130 may also be inserted and removed with an extrusion screw that replaces the confinement provided by the quartz lids.

The electrical current flows from the inner 1110 to outer electrode 1120 or vice versa in a radial manner, the carbon source 1130 is confined and is joule heated by the outer graphite electrodes 1110 and 1120. In some embodiments, the inner 1110 and outer electrodes 1120 may be liquid cooled.

Radiation cooling may occur from the carbon source 1130 to the outer graphite electrode 1120 with high efficiency as the graphite is a black body heat receptor. The outer graphite electrode 1120 is also heated by conduction from the carbon source 1130 but may then re-radiate the heat from its outer surface and may be cooled additionally by convection or conduction from the outside. The outer electrode 1120 may be porous graphite, which allows for gas and heat to leave the carbon source more efficiently. The outer electrode 1120 may also have holes spread along its surface to allow gas escape from the inside to the outside of the electrode. No consumable quartz tubes are needed as the graphite electrode confines the carbon source and converted graphene. The graphite electrodes 1120, 1110 may be used almost indefinitely with minimal wear.

Figure 11B:
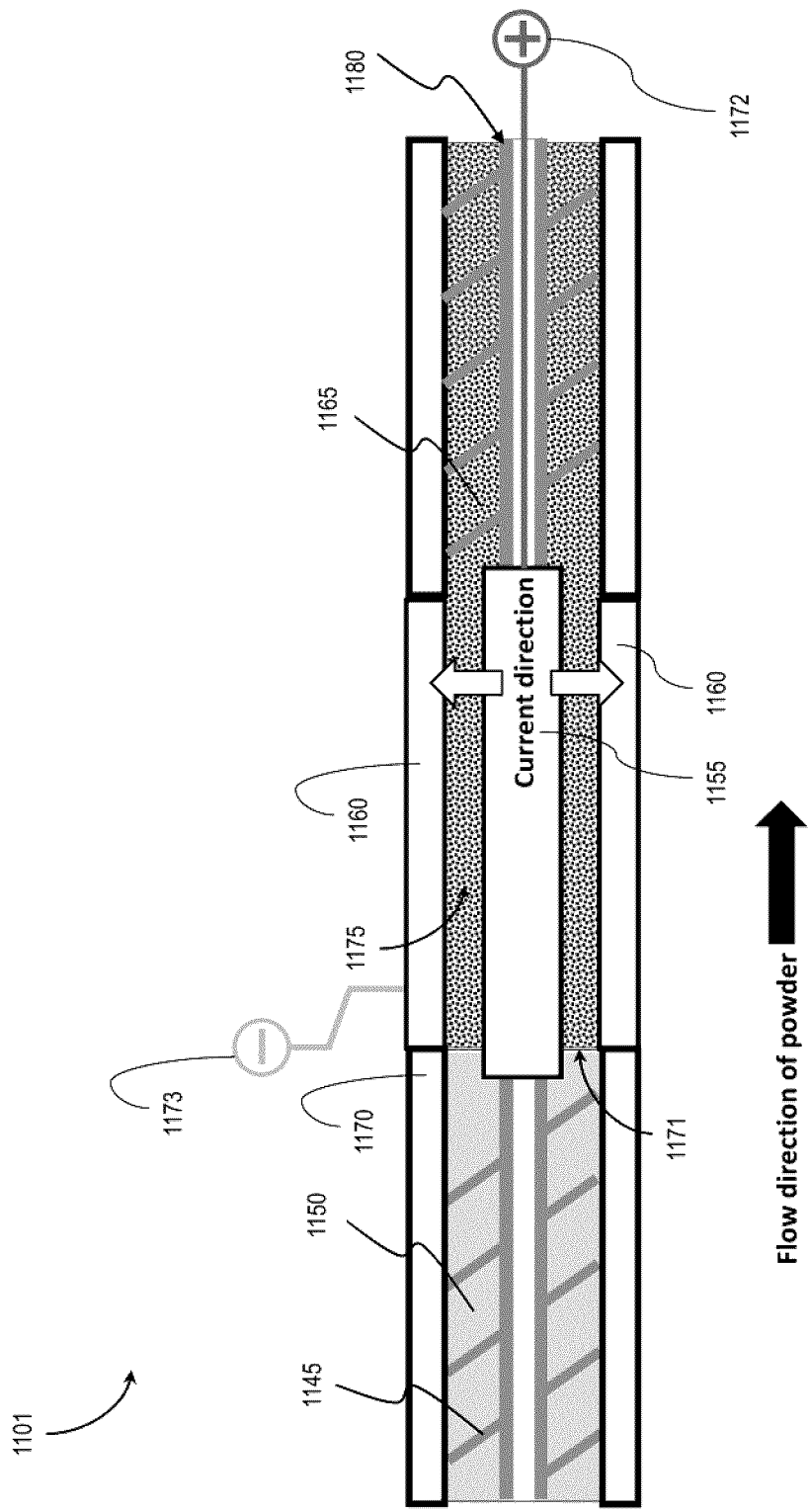
FIG. 11B is a diagram of a cross section view of a device for continuous and batch synthesis of graphene utilizing a radial electrode arrangement, and an extrusion screw which moves the carbon source in and out of the radial space of the device, according to an embodiment.

Referring to FIG. 11B, illustrated therein is a diagram of a cross section view of a device 1101 for continuous synthesis of graphene utilizing a radial electrode arrangement, and an extrusion screw 1145 which moves the carbon source 1150 in and out of the radial space of the device 1101, according to an embodiment. The device 1101 includes an inner 1155 and an outer 1160 electrode aligned in a radial manner. The device 1101 also includes an extrusion screw 1145 that moves the carbon source powder 1150 from an external reservoir (not shown) into a ceramic tube conduit 1170 and then into the radial space between the radial electrodes 1155, 1160. The tube 1170 is the container and the carbon source 1150 is moved into the entry opening 1171 of the container. The extrusion screw 1145 has a hollow shaft 1180. The inner electrode 1155 may be fixed to the shaft of the extrusion screw 1145 and an electrical connection may be passed through the hollow shaft. The positive terminal 1172 and negative terminal 1173 are connected to a power supply for operation in either alternating current (AC), direct current (DC), or a combination of AC and DC. During operation, the space 1175 for joule heating the carbon source 1150 between the electrodes 1155, 1160 is filled with the carbon source 1150 and the joule heating of the carbon source 1150 is executed. The synthesized graphene 1165 in the space for joule heating the carbon source 1150 between the electrodes 1155, 1160 is removed through an exit opening. The movement of the carbon source 1150 is continuous and is not obstructed by the electrodes 1155, 1160. Further, the flow of carbon source 1150 is lengthwise down the tube, whereas the electrical current flow is in the radial direction.

Figure 12:
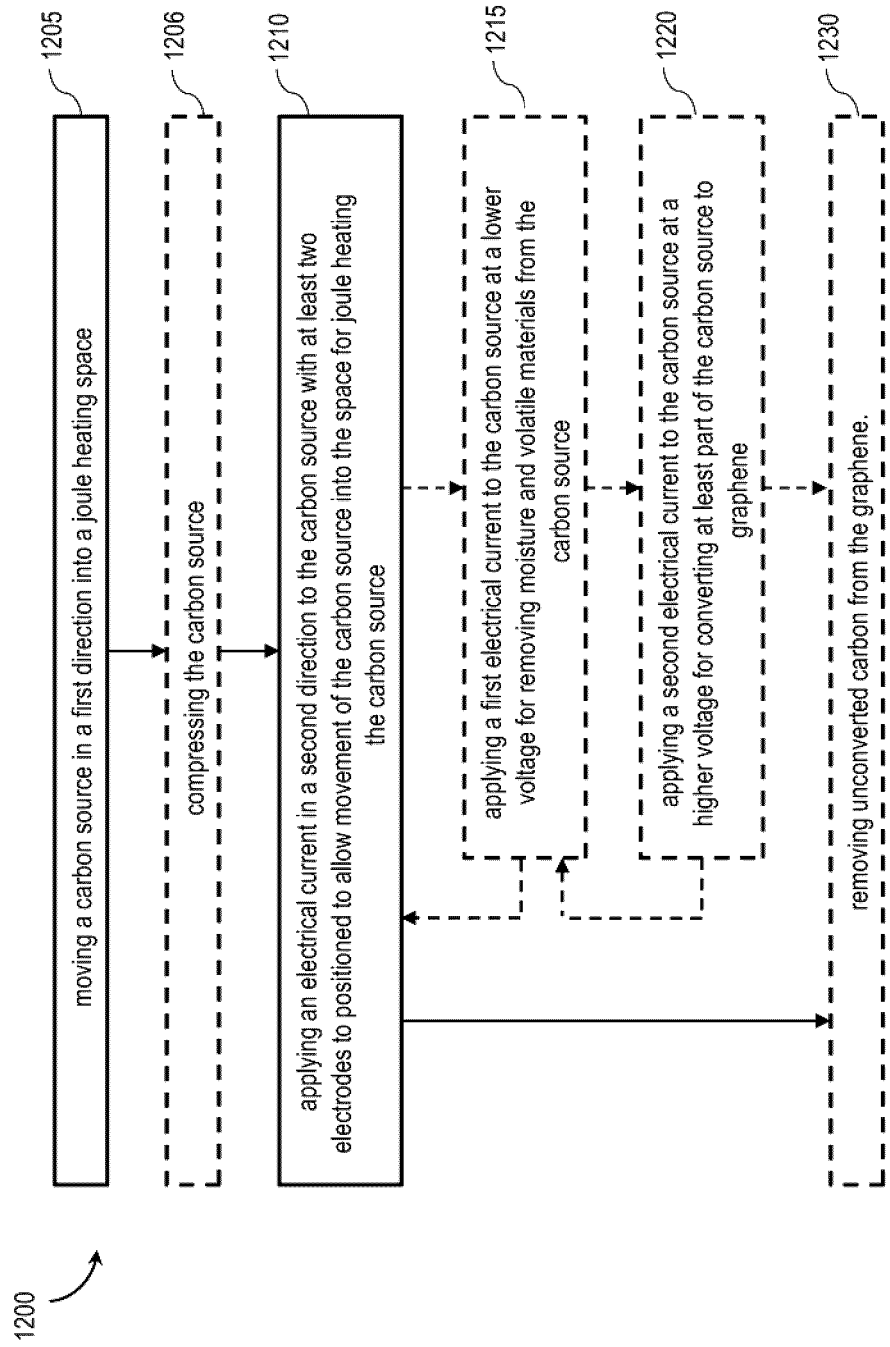
FIG. 12 illustrates a flow chart of a method for synthesis of graphene, according to an embodiment.

Referring to FIG. 12, illustrated therein is a flow chart of a method for synthesis of graphene, according to an embodiment. The method 1200 includes moving a carbon source in a first direction into a space for joule heating the carbon source, at 1205. The method 1200 optionally includes compressing the carbon source, at 1206. The method 1200 also includes applying an electrical current to the carbon source in a second direction to convert at least part of the carbon source into graphene with the at least two electrodes positioned to allow movement of the carbon source into the space for joule heating the carbon source, at 1210. The method 1200 at 1210 may optionally include an additional step at 1215 which includes applying a first electrical current to the carbon source at a lower voltage for removing moisture and volatile materials from the carbon source. The lower voltage generates lower process temperatures that remove moisture and volatiles from the carbon source but does not convert the carbon source into graphene. The method 1200 at 1210 may optionally include an additional step at 1220 which includes applying a second electrical current at a higher voltage for converting at least part of the carbon source to graphene. The higher voltage enables joule heating of the carbon source and conversion into graphene. The method 1200 may optionally include removing unconverted carbon from the graphene, at 1230.

While the above description provides examples of one or more apparatus, methods, or systems, it will be appreciated that other apparatus, methods, or systems may be within the scope of the claims as interpreted by one of skill in the art.

The invention claimed is:

1. A device for synthesis of graphene, the device comprising:
   a container having a space for holding a carbon source, wherein the container has an entry opening for receiving the carbon source;
   at least two electrodes for applying an electrical current through the space for joule heating the carbon source, wherein the space for joule heating the carbon source is between the at least two electrodes, wherein the at least two electrodes are positioned to radially apply an electrical current through the space for joule heating the carbon source; and
   a movement component for moving the carbon source, with respect to the container, into the entry opening in a first direction and the at least two electrodes apply the electrical current in a second direction, wherein the first direction is not the same as the second direction.

2. The device of claim 1, further comprising an exit opening positioned relative to the at least two electrodes to allow for moving the graphene out of the space for joule heating the carbon source, and wherein the entry opening is positioned relative to the at least two electrodes to allow for moving of the carbon source into the space for joule heating the carbon source while applying the electrical current.

3. The device of claim 1, further comprising a power supply connected to the electrodes for passing the electrical current through the electrodes to convert at least part of the carbon source in the space for joule heating the carbon source into graphene.

4. The device of claim 1, wherein the at least two electrodes include vents for escape of gas when the electrical current is applied to the carbon source.

5. The device of claim 1, wherein the space for joule heating the carbon source is surrounded by at least one quartz wall.

6. The device of claim 1 further comprising a carbon source reservoir for holding the carbon source prior to moving into the space for joule heating the carbon source and a graphene reservoir for collecting the graphene after moving out of the space for joule heating the carbon source.

7. The device of claim 1 further comprising a compression component for compressing the carbon source.

8. The device of claim 7 wherein the compression component is a compression corkscrew.

9. The device of claim 1, wherein the at least two electrodes are positioned opposite to each other.

10. The device of claim 1, wherein the graphene is turbostratic graphene.

11. A device for synthesis of graphene, the device comprising:
    an inner electrode and an outer electrode;
    a space for joule heating the carbon source for a carbon source between the inner electrode and the outer electrode, wherein the inner electrode and outer electrode are positioned to radially apply an electrical current through the space for joule heating the carbon source;
    an entry opening positioned relative to the inner electrode and outer electrode to allow for moving of the carbon source into the space for joule heating the carbon source; and
    a power supply connected to the inner electrode and outer electrode for passing the electrical current through the inner electrode and outer electrode to convert at least part of the carbon source in the space for joule heating the carbon source into graphene.

12. The device of claim 11, wherein the outer electrode surrounds the space for joule heating the carbon source.

13. The device of claim 11 further comprising a cooling component for cooling at least one of the group comprising the inner electrode and the outer electrode.

14. A device for synthesis of graphene, the device comprising:
    a container having a space for holding a carbon source, wherein the container has an entry opening for receiving the carbon source;
    at least two ring electrodes for applying an electrical current through the space for joule heating the carbon source, wherein the space for joule heating the carbon source is between the at least to ring electrodes;
    and a movement component for moving the carbon source, with respect to the container, into the entry opening in the same direction the at least two ring electrodes apply the electrical current.

15. The device of claim 14 further comprising an exit opening positioned relative to the at least two ring electrodes to allow for moving the graphene out of the space for joule heating the carbon source, and wherein the entry opening is positioned relative to the at least two electrodes to allow for moving of the carbon source into the space for joule heating the carbon source while applying the electrical current.

16. The device of claim 14 further comprising a power supply connected to the electrodes for passing the electrical current through the at least two ring electrodes to convert at least part of the carbon source in the space for joule heating the carbon source into graphene.

17. The device of claim 14 further comprising pretreatment ring electrodes for heating the carbon source to temperatures between 400° C.-800° C.

18. The device of claim 14, wherein the at least two electrodes are configured to apply an electric current which heats the carbon source to temperatures between 2800° C.-3200° C.

19. The device of claim 14 further comprising a carbon source reservoir for holding the carbon source prior to moving into the space for joule heating the carbon source and a graphene reservoir for collecting the graphene after moving out of the space for joule heating the carbon source.

* * * * *